United States Patent
Lee et al.

(10) Patent No.: US 7,944,516 B2
(45) Date of Patent: May 17, 2011

(54) LIQUID CRYSTAL DISPLAY DEVICE HAVING A DUMMY PATTERN FOR REPAIRING DATA LINES

(75) Inventors: Kyoung Mook Lee, Seoul (KR); Jae Young Oh, Uiwang (KR); Kye Chan Song, Anyang (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/831,747

(22) Filed: Jul. 7, 2010

(65) Prior Publication Data

US 2010/0273276 A1 Oct. 28, 2010

Related U.S. Application Data

(62) Division of application No. 11/452,785, filed on Jun. 14, 2006, now Pat. No. 7,773,170.

(30) Foreign Application Priority Data

Jun. 29, 2005 (KR) .................................. 2005-57341
May 17, 2006 (KR) .................................. 2006-44415

(51) Int. Cl.
*G02F 1/1333* (2006.01)
*G02F 1/136* (2006.01)
*G02F 1/13* (2006.01)
*G09G 3/36* (2006.01)

(52) U.S. Cl. .............. 349/54; 349/55; 349/192; 349/42; 349/43; 349/139; 345/92

(58) Field of Classification Search ............. 349/42–43, 349/54–55, 192; 345/92; 257/59, 72
See application file for complete search history.

(56) References Cited

U.S. PATENT DOCUMENTS

| | | | |
|---|---|---|---|
| 5,859,679 A | 1/1999 | Song | |
| 5,995,178 A | 11/1999 | Fujikawa et al. | |
| 6,057,896 A | 5/2000 | Rho et al. | |
| 6,317,176 B1 * | 11/2001 | Kim et al. | 349/54 |
| 6,476,882 B1 | 11/2002 | Sakurai | |
| 6,577,357 B2 * | 6/2003 | Kida | 349/54 |
| 6,618,101 B1 * | 9/2003 | Kim et al. | 349/54 |
| 6,744,486 B2 | 6/2004 | Kim et al. | |
| 2002/0054248 A1 | 5/2002 | Cheng et al. | |

FOREIGN PATENT DOCUMENTS

| | | |
|---|---|---|
| CN | 1414422 | 4/2003 |
| JP | 11-119694 | 4/1999 |
| JP | 2000044277 | 2/2000 |
| JP | 2000-250436 | 9/2000 |
| JP | 2006-11162 | 1/2006 |

OTHER PUBLICATIONS

Notification of First Office Action for corresponding Chinese Patent Application Serial No. 2006100903140, dated Sep. 28, 2007.
Office Action issued in corresponding Japanese Patent Application No. 2006-163599, issued Jun. 9, 2009.

* cited by examiner

*Primary Examiner* — Hoan C Nguyen
(74) *Attorney, Agent, or Firm* — Brinks Hofer Gilson & Lione

(57) ABSTRACT

A liquid crystal display device and its fabrication method may prevent occurrence of light leakage generated from the sides of a data line. A dummy pattern at sides of the data line with glass powder as an insulation film may simplify the repairing process. A method for fabricating a liquid crystal display device includes a gate electrode, a gate line, a dummy pattern and a first insulation film that are formed on a substrate. A switching element is formed on a portion of the gate electrode and includes a source electrode, a drain electrode and an active layer. A data line formed at a portion of the dummy pattern. A second insulation film is formed on the substrate and has a first contact hole that exposes a portion of the drain electrode. A pixel electrode is formed on the substrate and is electrically connected with the drain electrode through the first contact hole.

24 Claims, 10 Drawing Sheets

LIQUID CRYSTAL DISPLAY DEVICE HAVING A DUMMY PATTERN FOR REPAIRING DATA LINES

The present patent document is a divisional of U.S. patent application Ser. No. 11/452,785, filed Jun. 14, 2006, which claims priority to Korean Patent Application No. 57341/2005 filed in Korea on Jun. 29, 2005 and Korean Patent Application No. 44415/2006 filed in Korea on May 17, 2006, which is hereby incorporated by reference.

BACKGROUND

As the consumer's interest in information displays is growing and the demand for portable (mobile) information devices is increasing, research and commercialization of light and thin flat panel displays ("FPD") has increased. Flat panel displays may replace the Cathode Ray Tube ("CRT"), which is the most common existing display device.

The liquid crystal display ("LCD") is a FPD device for displaying images by using optical anisotropy of liquid crystal. LCD devices exhibit excellent resolution and color and picture quality, and as a result, they are widely applied for notebook computers or desktop monitors, and the like. In general, in the LCD device, a data signal according to image information is separately supplied to liquid crystal cells arranged in a matrix form and light transmittance of the liquid crystal cells is controlled for displaying the desired image.

The LCD device will now be described in detail with reference to FIG. 1. FIG. 1 is an exploded perspective view showing the structure of a general related art LCD device. As shown in FIG. 1, the LCD device includes a color filter substrate 5, namely, a first substrate, an array substrate 10, namely, a second substrate, and a liquid crystal layer 30 formed between the color filter substrate 5 and the array substrate 10. The color filter substrate 5 includes a color filter (C) comprising sub-color filters 7 for implementing red (R), green (G) and blue (B) color, a black matrix 6 for discriminating the sub-color filters 7 and blocking light transmitted through the liquid crystal layer 30, and a transparent common electrode 8 for applying a voltage to the liquid crystal layer 30.

The array substrate 10 includes gate lines 16 and data lines 17 which are arranged on the substrate 10 and define pixel regions P. A thin film transistor ("TFT") T, a switching element, is formed at respective crossings of the gate lines 16 and the data lines 17, and a pixel electrode 18 is formed at each pixel region P. The pixel region P is a sub-pixel corresponding to one sub-color filter 7 of the color filter substrate 5, and a color image is obtained by combining three types of red, green and blue sub-color filters 7. Namely, the three red, green and blue sub-pixels form a single pixel, and the TFTs are connected with the red, green and blue sub-pixels.

The fabrication process of an LCD device may be divided into an array process for forming the switching elements on the array substrate and a color filter process for forming the color filters. When the array substrate and the color filter substrate are fabricated through the array process and the color filter process, they are attached through a cell process to complete a liquid crystal display panel. The cell process does not include a process that is repetitive as compared with the array process and the color filter process. The cell process may be divided into an alignment film forming process for alignment of liquid crystal molecules, a cell gap forming process, a cutting process and a liquid crystal injection process. The liquid crystal display panel fabricated through the above processes is screened through an inspection. When the liquid crystal display panel is determined to be good, polarization plates are attached on outer sides of the liquid crystal display panel and a driving circuit is connected thereto to complete the LCD device.

In the above-described inspecting process of the LCD device, a test pattern is displayed on the screen of the liquid crystal display panel to check whether there are any defective pixels. When a defective pixel is found, a repairing process is performed. Defects of the LCD device may include a color deficiency of any of the pixels, a point defect such as spots (in a continuous ON state) or dark points (in a continuous OFF state). Additional defects may be a short circuit or opening between adjacent interconnections, a line defect caused by a breakdown of a switching element due to static electricity, and the like. Specifically, a disconnection of a data line is a line defect. In the case of a point defect, it may be tolerated to a degree depending on its distribution, number and type, but in the case of a line defect, even one line defect is too critical. A line defect significantly impairs the quality of the display and its inclusion would result in a loss of value of the product.

In this case, if a pixel electrode overlaps a data line or is formed near a data line to improve the aperture ratio, parasitic capacitance may be generated between the data line and the pixel electrode. Then, the liquid crystal layer positioned to the left and right side of the data line would be arranged in an undesirable direction, causing light leakage in the region.

BRIEF SUMMARY

In a first aspect, a liquid crystal display device includes a gate electrode, a gate line and a dummy pattern that are formed on a substrate. A first insulation film is formed on the substrate. Additionally, a switching element is formed on a portion of the gate electrode and comprises a source electrode, a drain electrode and an active layer. A data line formed at a portion of the dummy pattern and a second insulation film is formed on the substrate and has a first contact hole that exposes a portion of the drain electrode. A pixel electrode is formed on the substrate and is electrically connected with the drain electrode through the first contact hole.

In a second aspect, a method for fabricating a liquid crystal display device includes forming a gate electrode, a gate line and a dummy pattern on a substrate. Then a first insulation film is formed on the substrate and a switching element is formed on the first insulation film. The switching element comprises a source electrode, a drain electrode and an active layer at a portion of the gate electrode. A data line is formed at a portion of the dummy pattern and a second insulation film is formed on the substrate. A first contact hole is formed from removal of the second insulation film. The first contact hole exposes a portion of the drain electrode. A pixel electrode is formed that electrically connects with the drain electrode through the first contact hole.

In a third aspect, a liquid crystal display device includes a gate electrode, a gate line and a dummy pattern formed on a substrate. A first insulation film is formed on the gate electrode and gate line. The first insulation film may comprise a glass powder. A switching element is formed on a portion of the gate electrode and comprises a source electrode, a drain electrode and an active layer. A data line is formed on the substrate that intersects the gate line. The dummy pattern is formed adjacent to at least one side of the data line. A second insulation film is formed on the substrate and has a first contact hole exposing a portion of the drain electrode. A pixel electrode is formed on the substrate and electrically connected with the drain electrode through the first contact hole.

In a fourth aspect, a liquid crystal display device includes a gate electrode, a gate line and a dummy pattern formed on a substrate. A first insulation film is formed on the gate electrode and gate line. A switching element is formed on a portion of the gate electrode and includes a source electrode, a drain electrode and an active layer. A data line is formed on the substrate that intersects the gate line. The dummy pattern is formed adjacent to at least one side of the data line. A connection line connects the dummy pattern with the data line. A second insulation film is formed on the substrate over the connection line. The second insulation film has a first contact hole exposing a portion of the drain electrode. A pixel electrode is formed on the substrate and electrically connected with the drain electrode through the first contact hole.

The foregoing and other embodiments, features, aspects and advantages of the present disclosure will become more apparent from the following detailed description of the present disclosure when taken in conjunction with the accompanying drawings.

BRIEF DESCRIPTION OF THE DRAWINGS

The accompanying drawings, which are included to provide a further understanding of the embodiments and are incorporated in and constitute a part of this specification, illustrate embodiments of the disclosure and together with the description serve to explain the principles of the embodiments.

In the drawings.

DETAILED DESCRIPTION OF THE DRAWINGS AND THE PRESENTLY PREFERRED EMBODIMENTS

A liquid crystal display (LCD) device and its fabrication in accordance with embodiments of the present disclosure will now be described with reference to the accompanying drawings.

Figure 1:
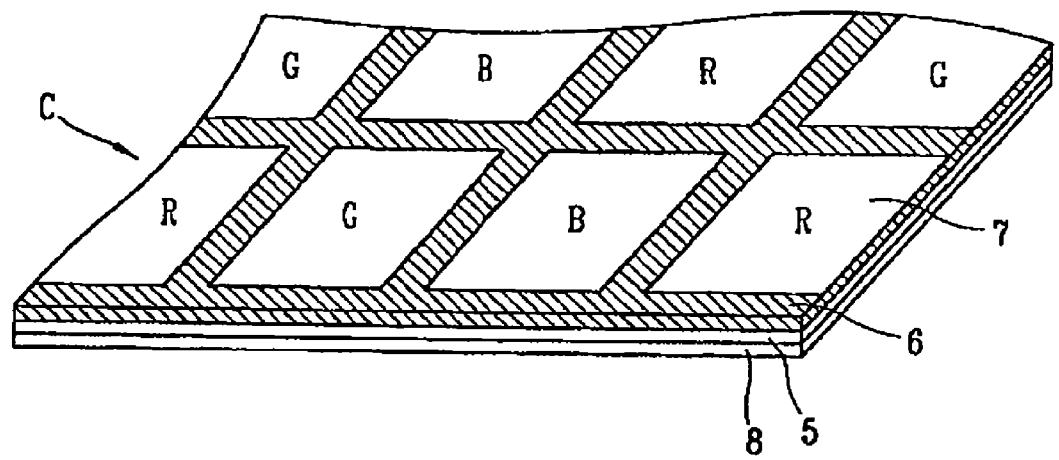
FIG. 1 is an exploded perspective view showing the structure of a general related art LCD device.
Figure 1:
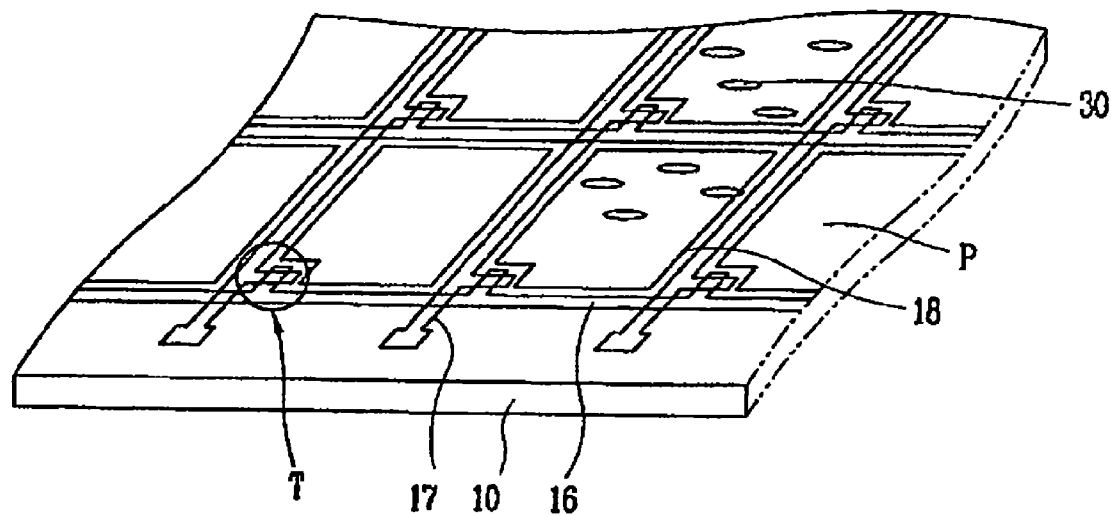
Figure 2:
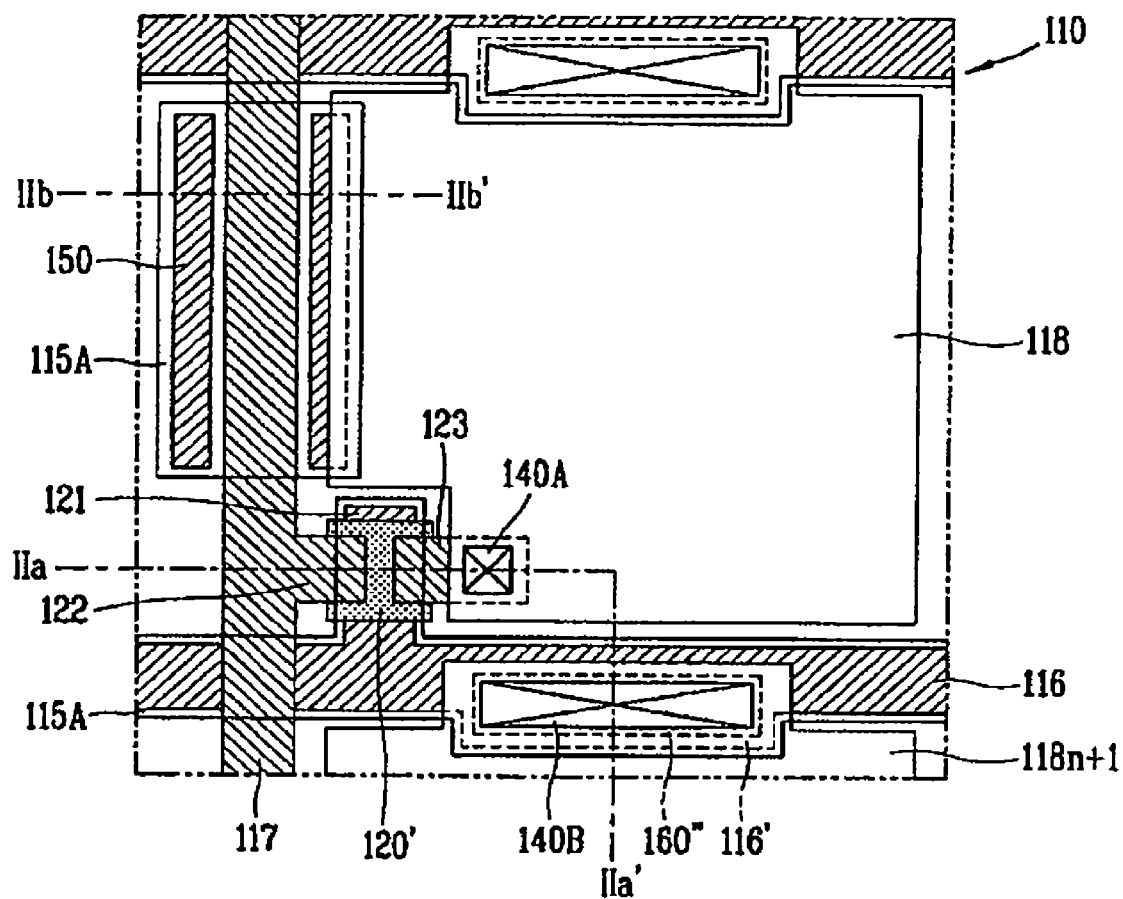
FIG. 2 is a plan view showing a portion of an array substrate of an LCD device in accordance with a first embodiment.

FIG. 2 is a plan view showing a portion of an array substrate of an LCD device in accordance with a first embodiment. There may be N number of gate lines and M number of data lines (not shown) formed to cross each other to define M×N number of pixels on the array substrate 110. However, in FIG. 2, the (m,n)th pixel is shown on the drawing merely for the sake of brevity.

As shown, the array substrate 110 includes a gate line 116 to which a scan signal is applied from an external driving circuit (not shown), a data line 117 to which an image signal is applied, a thin film transistor ("TFT"), namely, a switching element, formed at a crossing of the gate line 116 and the data line 117, and a pixel electrode 118 connected with the TFT.

The TFT includes a gate electrode 121 connected with the gate line 116, a source electrode 122 connected with the data line 117 and a drain electrode 123 connected with the pixel electrode 118. The TFT also includes a first insulation film 115A for insulating the gate electrode 121 and the source and drain electrodes 122 and 123 respectively, and an active layer 120' for forming a conductive channel between the source electrode 122 and the drain electrode 123 by a gate voltage supplied to the gate electrode 121. In this case, a second insulation film (not shown) having a first contact hole 140A is formed on the drain electrode 123, allowing the drain electrode 123 and the pixel electrode 118 to be electrically connected with each other through the first contact hole 140A.

A portion of the (m, n+1)th pixel electrode ($118n+1$) extends toward a gate line 116 of a corresponding pixel, namely, the nth gate line 116 to overlap with a first storage electrode 116' formed as a portion of the gate line 116 protrudes. The overlapped first storage electrode 116' and the portion of the (m, n+1)th pixel electrode ($118n+1$) form a storage capacitor with the first insulation film 115A interposed therebetween.

A dummy pattern 150 is formed at certain left and right regions of the data line 117 in order to repair the data line 117 when a disconnection deficiency occurs at the data line 117. In this case, the dummy pattern 150 is formed by using and patterning a gate wire conductive material when a gate wire, namely, the gate electrode 121 and the gate line 116. In this embodiment, the dummy pattern 150 is formed at both the left and right sides of the data line 117, however, in other embodiments the dummy pattern 150 may be formed only at one side of the data line 117 or in other arrangements. The dummy pattern 150 may be positioned between the data line 117 and the pixel electrode 118 and formed as an opaque gate wire to serve as a blocking film for preventing light leakage due to a parasitic capacitance generated between the data line 117 and the pixel electrode 118.

A second storage electrode 160" is formed at an upper portion of the first storage electrode 116', and the second storage electrode 160" may be electrically connected with the (m, n+1)th pixel electrode ($118n+1$) through a second contact hole 140B formed at the second insulation film. In this embodiment, the first insulation film 115A is a glass powder having a small dielectric constant (k) value. The glass powder forms a pattern through printing or coating and then sintering. The first insulation film 115A made of the glass powder is patterned to cover only the upper portion of the gate electrode 121, the gate line 116 and the dummy pattern 150, but other embodiments are not limited thereto.

When the dummy pattern 150 is formed at the left and right sides of the data line 117 and then the glass powder is formed at the upper portion in forming the gate wire, the glass powder can not only repair the data line 117 but also serve to prevent light leakage through the dummy pattern 150. In addition, since glass powder having the smaller dielectric constant value is used to form the first insulation film 115A, namely, the gate insulation film, the electrical characteristics of the TFT may be substantially improved.

Regarding the fabrication process of the LCD device, in fabricating the array substrate including the TFTs, a plurality of masking processes (namely, photolithography processes) may be required, so it is necessary to reduce the number of masking processes in terms of productivity.

FIGS. 3A to 3F are sectional views taken along line IIa-IIa' and IIb-IIb' of an array substrate in FIG. 2, showing a fabrication process, and FIGS. 4A to 4E are plan views showing a fabrication process of the array substrate in FIG. 2.

In this embodiment, the four masking processes (that is, four photolithography processes) are performed to form the array substrate, but without being limited thereto, may be applied regardless of the number of masking processes.

Figure 3A:
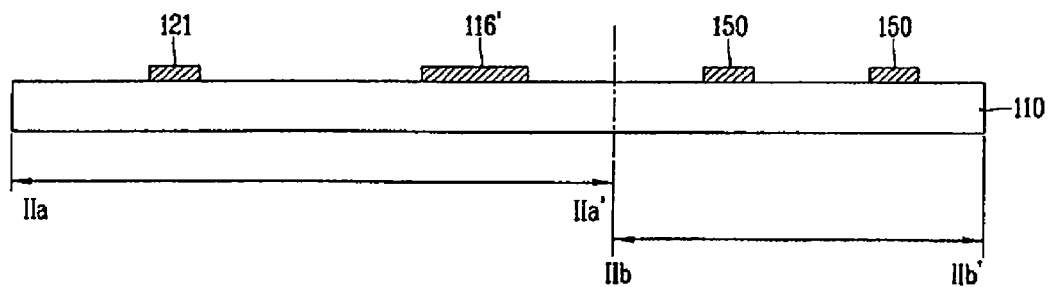
FIGS. 3A to 3H are sectional views taken along line IIa-IIa' and IIb-IIb' of an array substrate in FIG. 2, sequentially showing a fabrication process.
Figure 4A:
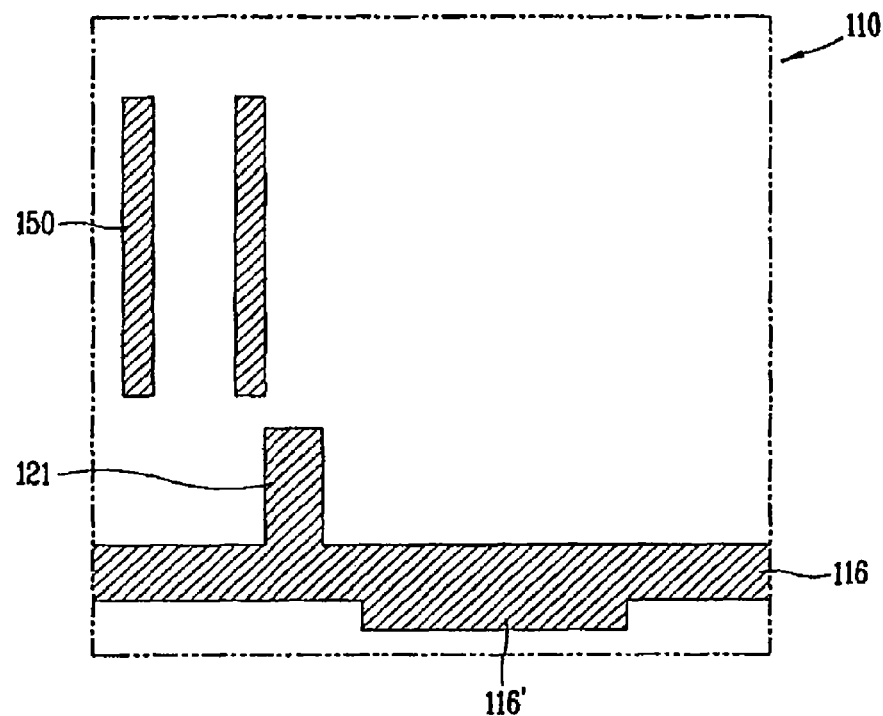
FIG. 4A to 4E are plan views sequentially showing a fabrication process of the array substrate in FIG. 2

As shown in FIGS. 3A and 4A, the gate line 116 including the gate electrode 121 and the storage electrode 116' and the dummy pattern 150 are formed on the substrate 110 made of a transparent insulation material such as glass. The dummy pattern 150 may be formed at left and right regions of the data line and serve to repair the data line and prevent light leakage between the data line and the pixel electrode.

After the first conductive material is deposited on the entire surface of the substrate 110, the gate electrode 121, the gate line 116, the first storage electrode 116' and the dummy pattern 150 are formed by patterning through the photolithography process (a first masking process). As the first conductive material, a low resistance opaque conductive material such as aluminum (Al), an Al alloy, tungsten (W), copper (Cu), Chromium (Cr), molybdenum (Mo), etc. may be used. In addition, the gate electrode 121, the gate line 116, the first storage electrode 116' and the dummy pattern 150 may be formed in a multi-layer structure in which two or more types of the low-resistance conductive materials are stacked. Additionally, according to this embodiment, the dummy pattern 150 may be formed by patterning the gate wire conductive material with the gate electrode 121, the gate line 116 and the first storage electrode 116'. Therefore, an additional masking process may not be necessary.

Figure 3B:
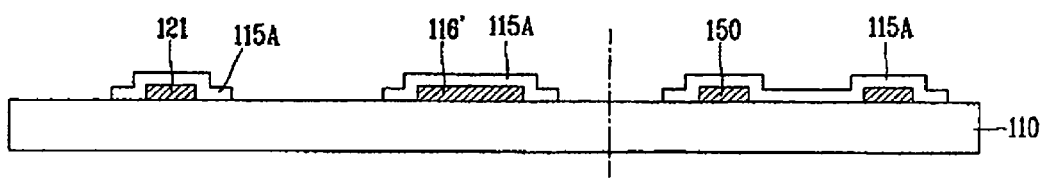
Figure 4B:
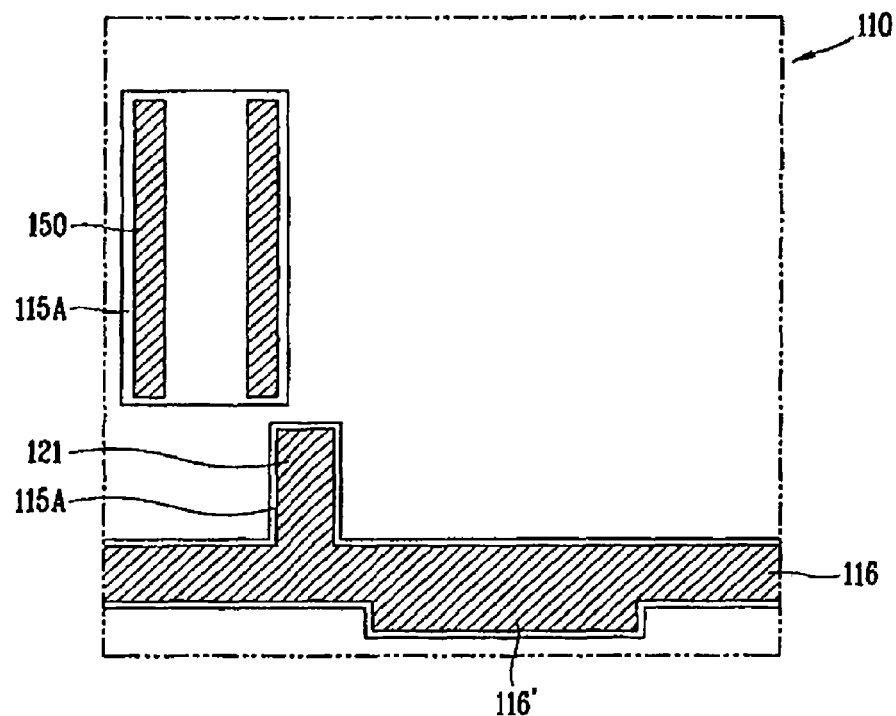

As shown in FIGS. 3B and 4B, the first insulation film 115A is formed to cover the gate electrode 121, the gate line 116, the first storage electrode 116' and the dummy pattern 150. As mentioned above, the first insulation film 115A may be formed by printing, depositing or sintering the glass powder. Through the printing method, the glass powder mixed in a solvent is patterned through printing and the solvent is then volatilized through sintering. In the sintering method, the powder is pressed into an appropriate form, which is then heated so as to be tightly bound and sintered. Since the glass powder has a relatively low dielectric constant value, it may be advantageously formed to be thin compared with other inorganic insulation film such as a silicon nitride film.

Figure 3C:
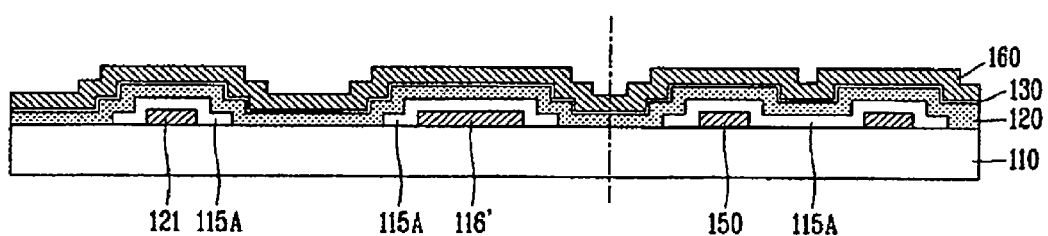

Next, as shown in FIG. 3C, an amorphous silicon thin film 120, an n+ amorphous silicon thin film 130 and a conductive film 160 formed of a second conductive material may be formed on the surface of the substrate 110 with the first insulation film 115A formed thereon.

Figure 3D:
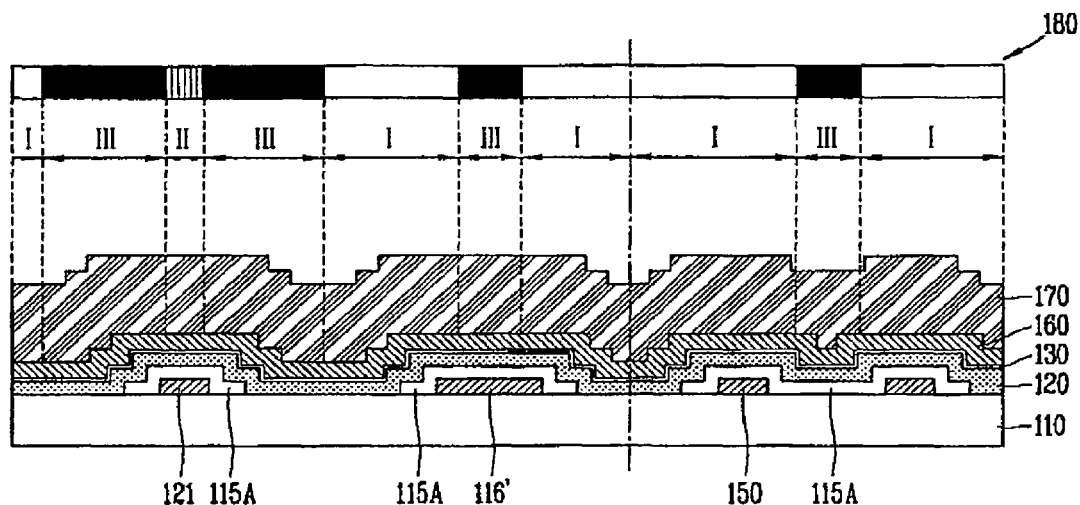

As shown in FIG. 3D, a photosensitive film 170 made of a photosensitive material such as photoresist is formed on the entire surface of the substrate 110, and light is irradiated onto the photosensitive film 170 through a slit (or diffraction) mask 180 including a slit region. The slit mask 180 includes a first transmission region (I) for transmitting entire light, a second transmission region (II) for transmitting a portion of light, and a blocking region (III) for blocking entire irradiated light. Only light which has transmitted through the mask 180 may be irradiated onto the photosensitive film 170.

When the slit mask 180 is used in this embodiment, the second transmission region (II) has a slit structure, and the amount of light irradiated through the second transmission region (II) is smaller than the amount of light irradiated onto the first transmission region (I), which allows substantially all of the light to be transmitted therethrough. Accordingly, after the photosensitive film 170 is coated, the photosensitive film 170 is exposed by using the mask 180 having the partial slit region (II) and developed. The thickness of the photosensitive film remaining at the slit region (II) and the thickness of the photosensitive film remaining at the first transmission region (I) and the blocking region (III) become different.

In one example, by using positive type photoresist as the photosensitive film 170, the thickness of the photosensitive film remaining at the slit region (II) may be smaller than that of the photosensitive film remaining at the blocking region (III). Alternatively, by using negative type photoresist as the photosensitive film 170, the thickness of the photosensitive film remaining at the slit region (II) may be smaller than that of the photosensitive film remaining at the first transmission region (I). According to this embodiment, the positive type photoresist is used but alternate embodiments are not limited thereto and the negative type photoresist may be also used.

Figure 3E:
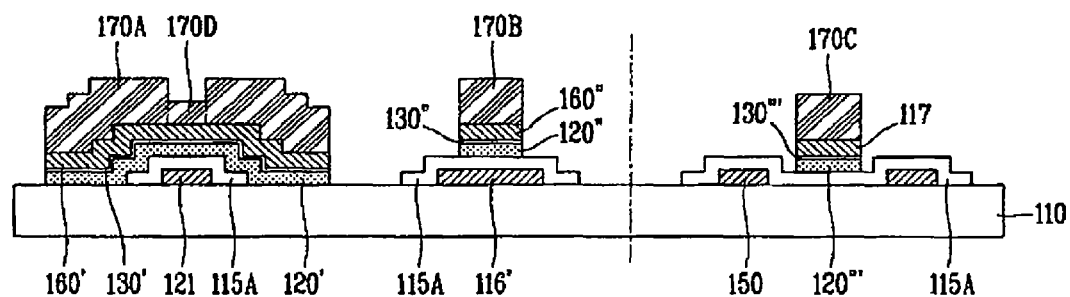

Subsequently, when the photosensitive film 170 that is exposed through the slit mask 180 is developed (a second masking process), as shown in FIG. 3E, the photosensitive patterns 170A-170D each with a certain thickness remain at regions where the light is blocked or partially blocked through the blocking region (II) and the second transmission region (II). The photosensitive film at the region where light has been entirely irradiated through the first transmission region (I) is removed to expose the surface of the conductive film 160. In this case, the first to third photosensitive film patterns 170A to 170C formed through the blocking region (III) are thicker than the fourth photosensitive film pattern 170D formed at the second transmission region (II).

Specifically, in this embodiment, the first photosensitive film pattern 170A with a first thickness remains at an upper portion of source/drain electrode regions (namely, a region where the source and drain electrodes are to be formed through an etching process to be described) at the left portion of the drawing. The second photosensitive film pattern 170B with a first thickness remains at a certain region of the upper portion of the first storage electrode 116' at the central portion of the drawing, and the third photosensitive film pattern 170C with the first thickness remains between the pair of dummy patterns 150 at the right portion of the drawing. In addition, the fourth photosensitive film pattern 170D with a second thickness remains between the source electrode region and the drain electrode region.

Thereafter, the conductive film 160, the n+ amorphous silicon thin film 130 and the amorphous silicon thin film 120 may be selectively removed by using the photosensitive film patterns 170A-170D to form the active layer 120' formed of the amorphous silicon thin film at the upper portion of the gate electrode 121. The second storage electrode 160'' formed of the conductive film at the upper portion of the storage electrode 116', and the data line 117 formed of the conductive film at the upper portion between the dummy pattern 150.

In this case, the first n+ amorphous silicon thin film pattern 130' formed of the n+ amorphous silicon thin film and the first conductive film pattern 160' formed of the conductive film may be formed at the upper portion of the active layer 120'. The second amorphous silicon thin film pattern 120'' and the second n+ amorphous silicon thin film pattern 130'' patterned in the same form may be formed at the lower portion of the second storage electrode 160''. In addition, a third amorphous silicon thin film pattern 130''' and a third n+ amorphous silicon thin film pattern 130''' patterned in the same form or shape, may be formed at the lower portion of the data line 117.

Figure 3F:
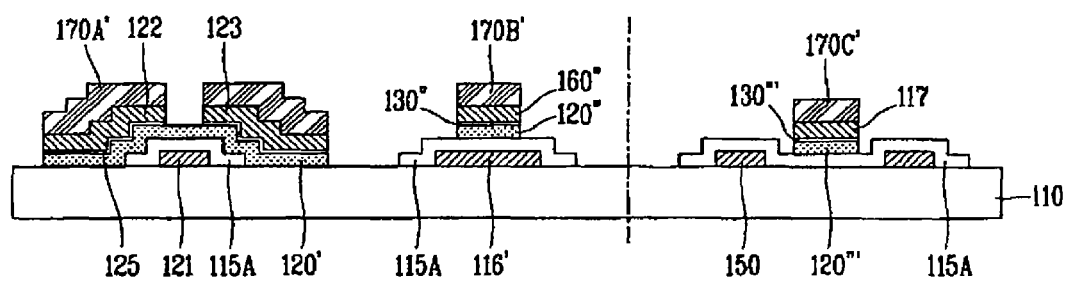
Figure 4C:
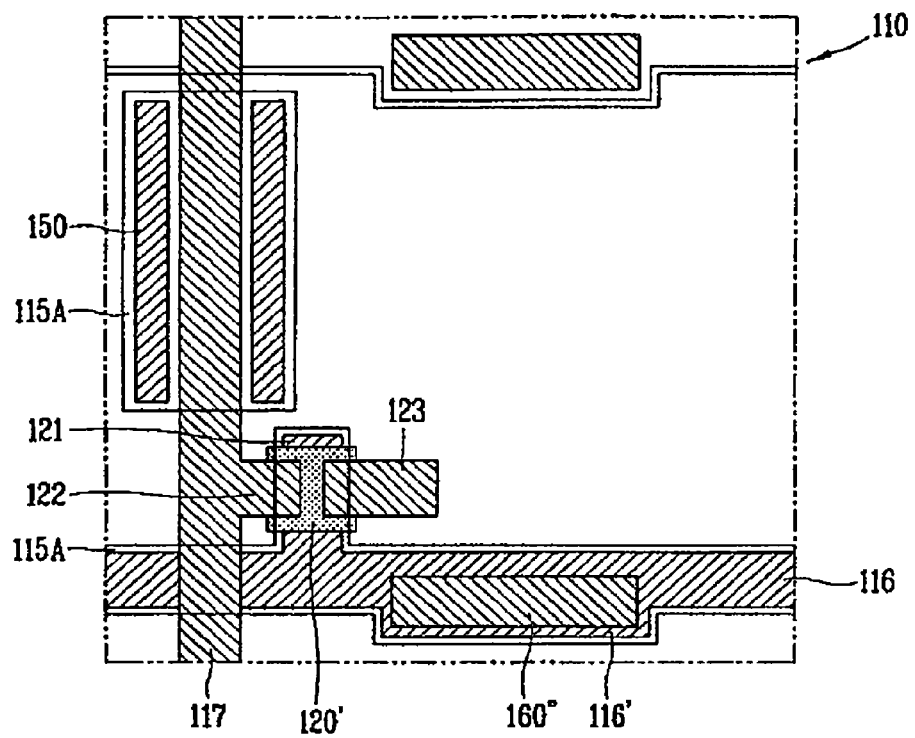

The fourth photosensitive film pattern 170D of the second transmission region (II) may be completely removed through an ashing process in this embodiment. As shown in FIGS. 3F and 4C, the first photosensitive film pattern 170A, the second photosensitive film pattern 170B and the third photosensitive film pattern 170C are removed possibly as much as the thickness of the fourth photosensitive film pattern 170D of the second transmission region (II), thereby leaving a fifth photosensitive film pattern 170A', a sixth photosensitive film pattern 170B' and a seventh photosensitive film pattern 170C' each with a third thickness. When the first conductive film pattern 160' and the first n+ amorphous silicon thin film pattern 130' are selectively removed by using the remaining photosensitive film patterns 170A'~170C' as masks, the source electrode 122 and the drain electrode 123 with the first conductive film pattern 160' may be formed at the upper portion of the active layer 120'.

The first n+ amorphous silicon thin film pattern 130' may also be patterned in the same form to form an ohmic contact layer 125 for allowing the source and drain electrodes 122 and 123 and a certain region of the active layer 120' to ohmic-contact with each other. Accordingly, the active layer 120', the source and drain electrodes 122 and 123 and the data line 117 may be formed through a one time masking process, so the number of masks may be reduced. However, alternate embodiments are not limited thereto, and the source and drain electrodes 122 and 123 may be formed through a separate masking process, different from a masking process for the active layer 120'. That is, the active layer 120' and the source and drain electrodes 122 and 123 and the data line 117 may be formed through two instances of separate masking processes.

In this embodiment, when a line defect occurs upon a portion of the data line 117 being disconnected, a repairing process is performed to reconnect the disconnected data line 117 with the dummy pattern 150 formed at the left and right sides of the data line 117 by using a connection line (not shown). The repairing process may be performed such that the first insulation film 115A over the upper and lower portions of the disconnected data line 117 is melted by using a laser to expose the surface of the dummy pattern 150. The exposed dummy pattern 150 and the disconnected upper and lower portions of the data line 117 may be connected by the connection line through welding.

Figure 3G:
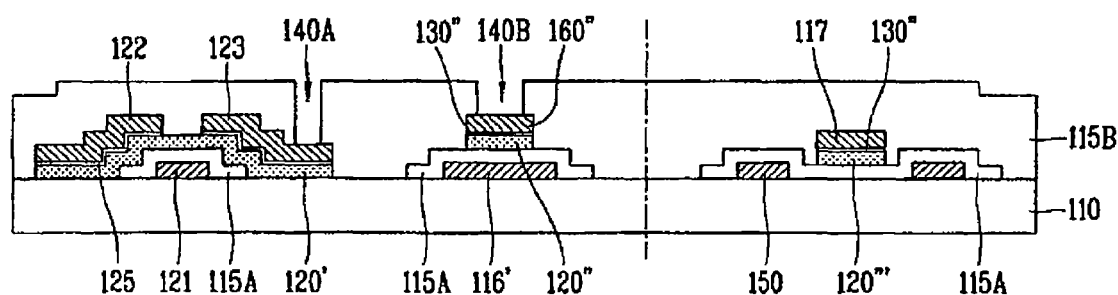
Figure 4D:
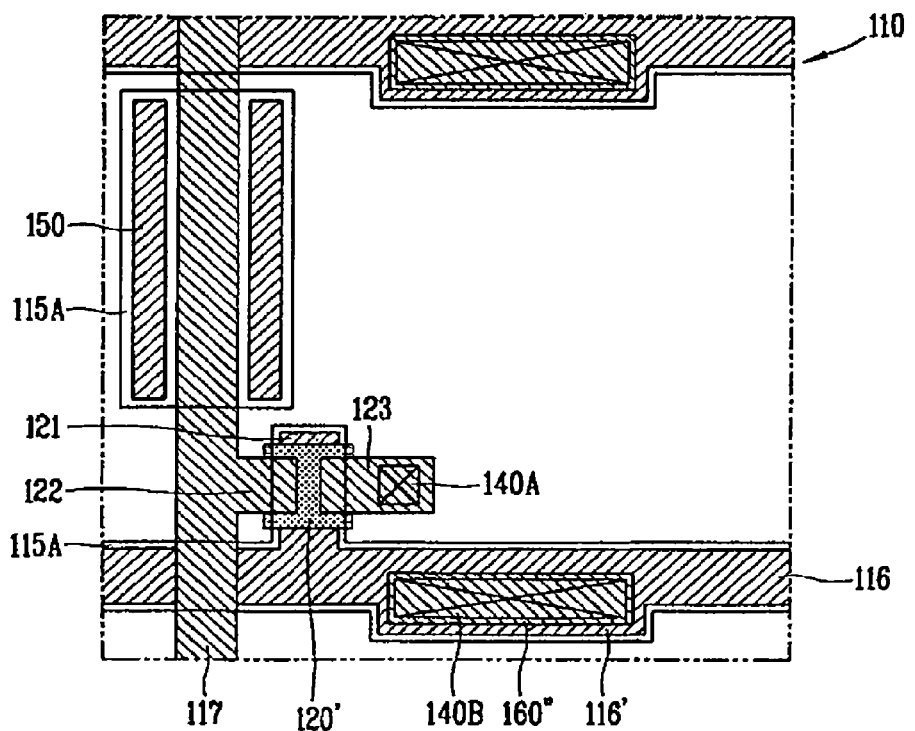

Next, as shown in FIGS. 3G and 4D, the second insulation film 115B is formed on the entire surface of the substrate 110. And then, the second insulation film 115B is selectively patterned by using the photolithography process (the third masking process) to form the first contact hole 140A exposing a portion of the drain electrode 123 and at the same time forming the second contact hole 140B exposing a portion of the second storage electrode 160".

Figure 3H:
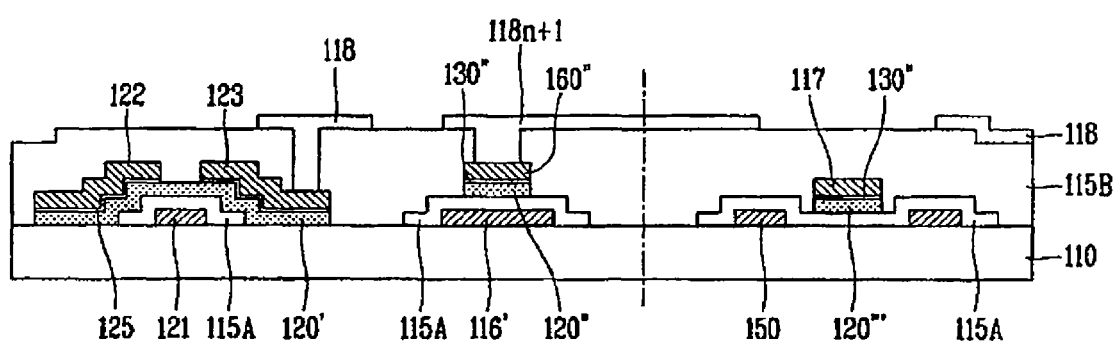
Figure 4E:
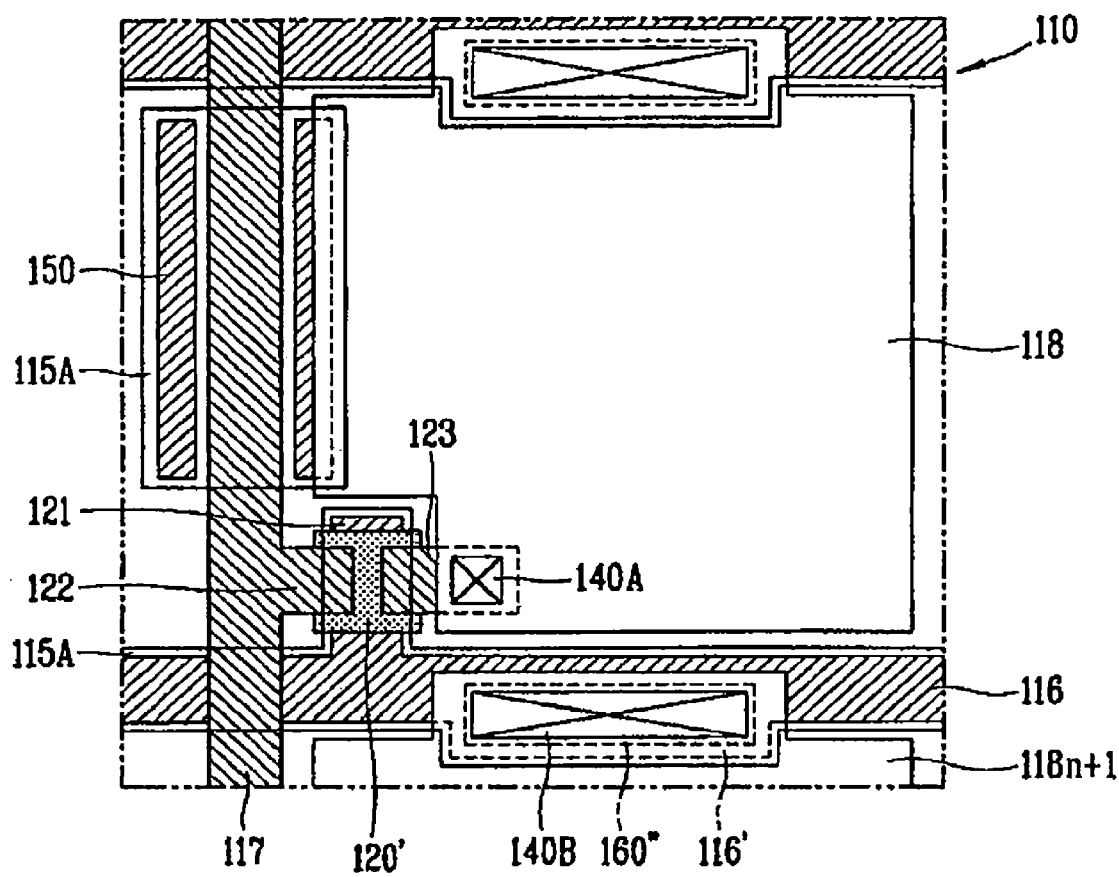

As shown in FIGS. 3H and 4E, a third conductive material is deposited on the entire surface of the substrate 110 and then patterned by using the photolithography process (a fourth masking process) to form the pixel electrodes 118 and 118n+1 which are electrically connected with the drain electrode 123 through the first contact hole 140A. In this case, a portion of the (m, n+1)th pixel electrode 118n+1 extends to the gate line 116 of the corresponding pixel to overlap with the gate line 116 and is electrically connected with the lower second storage electrode 160" through the second contact hole 140B.

The pixel electrodes 118 and 118n+1 may be formed to partially overlap with the lower dummy pattern 150 according to this embodiment. The pixel electrodes 118 and 118n+1 may be made of the transparent conductive material having the excellent transmittance such as ITO or IZO. In this example, since the dummy pattern 150 is formed by patterning the gate wire conductive material, an additional masking process may not be necessary. In addition, since the dummy pattern 150 is positioned at left and right sides of the data line 117, it may serve as a blocking film for preventing a light leakage caused by parasitic capacitance generated between the data line 117 and the pixel electrodes 118 and 118n+1.

In this embodiment, the array substrate is fabricated by using the four instances of masking processes, but without being limited thereto, alternate embodiments may be applied regardless of the number of the masking processes. In addition, the amorphous silicon TFT using the amorphous silicon thin film is taken as an example of one embodiment for the active layer, but without being limited thereto. An LCD device having polycrystalline silicon TFT using a polycrystalline silicon thin film as the active layer may also be used according to an alternate embodiment.

The present embodiments may be applied regardless of a mode of an LCD device, such as a twisted nematic (TN) mode, an in-plane switching (IPS) mode and a vertical alignment (VA) mode. In addition, the present embodiments may be used for a different display device fabricated by using the TFT, for example, an organic light emitting diode (OLED) display device in which an OLED is connected with a driving transistor.

In the first embodiment, the first insulation film 115A made of glass powder is formed to completely cover the dummy pattern 150, but the present embodiments are not limited thereto and the first insulation film 115A may cover only a portion of the dummy pattern 150. This will be described below in a second embodiment.

Figure 5A:
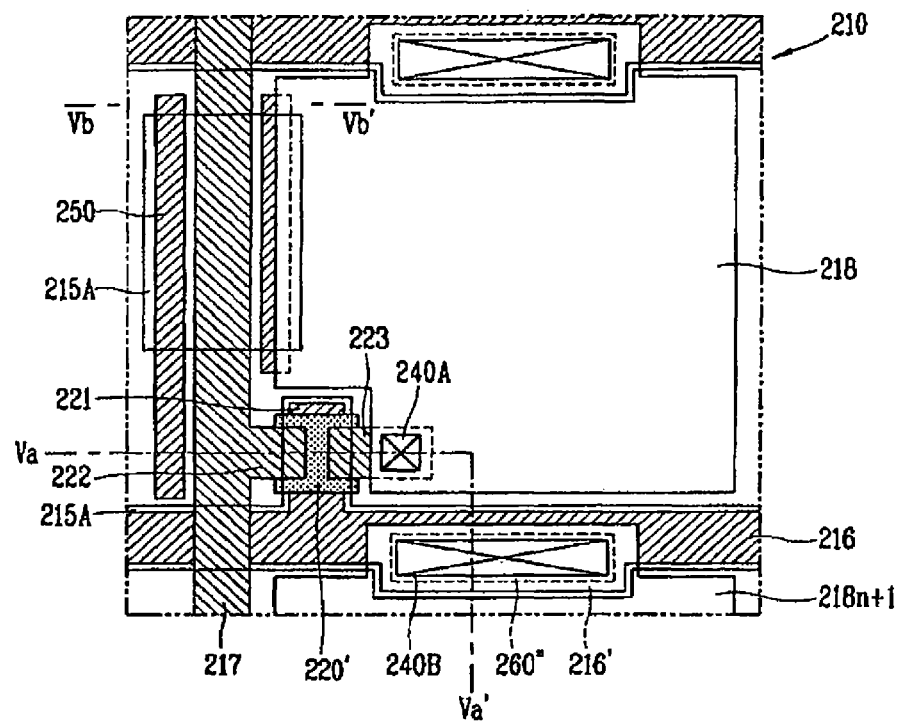
FIG. 5A is a plan view showing a portion of the array substrate of an LCD device in accordance with a second embodiment.
Figure 5B:
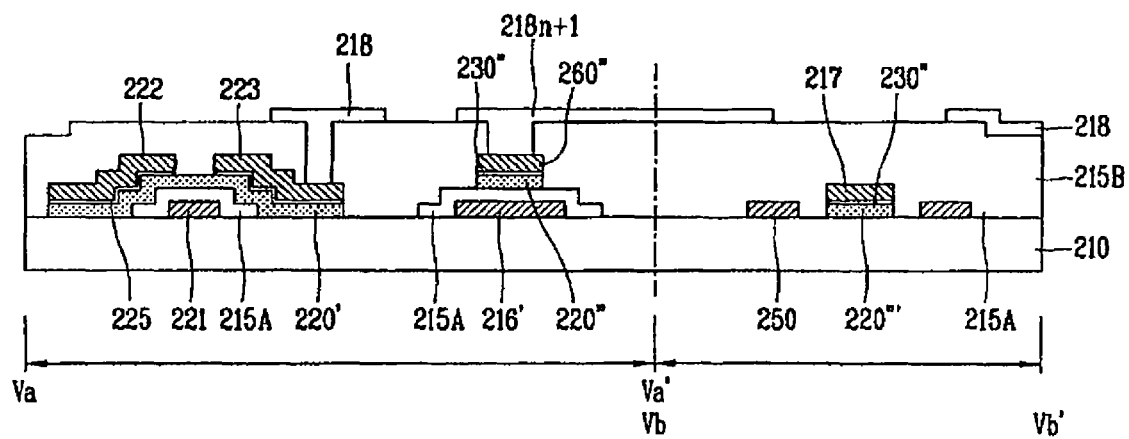
FIG. 5B is a view showing a section taken along lines Va-Va' and Vb-Vb' of the array substrate in FIG. 5A.

FIG. 5A is plan view showing a portion of the array substrate of an LCD device in accordance with a second embodiment, in which (m, n)th pixel is shown as an example. FIG. 5B is a view showing a section taken along lines Va-Va' and Vb-Vb' of the array substrate in FIG. 5A.

As shown in FIGS. 5A and 5B, in a second embodiment, an array substrate 210 includes a gate line 216 to which a scan signal is applied from an external driving circuit (not shown), a data line 217 to which an image signal is applied, a TFT, (or a switching element), formed at the crossing of the gate line 216 and the data line 217. The TFT includes a gate electrode 221 connected with the gate line 216, a source electrode 222 connected with the data line 217, and a drain electrode 223 connected with a pixel electrode 218. In addition, the TFT includes a first insulation film 215A for insulating the gate electrode 221, and the source and drain electrodes 222 and 223, and an active layer 220' for forming a conductive channel between the source electrode 222 and the drain electrode 223 by a gate voltage supplied to the gate electrode 221. A second insulation film 215B having a first contact hole 240A is positioned on the drain electrode 223, so that the drain electrode 223 and the pixel electrode 218 may be electrically connected through the first contact hole 240A.

A portion of the (m, n+1)th pixel electrode (218n+1) extends toward a gate line of a corresponding pixel, namely, the nth gate line 216 to overlap with a first storage electrode 216' formed as a portion of the gate line 116 protrudes. The overlapped first storage electrode 216' and the portion of the (m, n+1)th pixel electrode (218n+1) form a storage capacitor with the first insulation film 215A interposed therebetween. A dummy pattern 250 may be formed at certain left and right regions of the data line 217 in order to repair the data line 217 when disconnection deficiency occurs at the data line 217. As mentioned above, the dummy pattern 250 can be formed at a certain portion of left and right side of the data line. The dummy pattern 250 may be positioned between the data line 217 and the pixel electrode 218 and formed as an opaque gate wire to serve as a blocking film for preventing light leakage due to parasitic capacitance generated between the data line 217 and the pixel electrode 218.

A second storage electrode 260" may be formed at an upper portion of the first storage electrode 216', and the second storage electrode 260" is electrically connected with the (m, n+1)th pixel electrode (218n+1) through a second contact hole 240B formed at the second insulation film 215B. As mentioned above, the first insulation film 215A may be glass powder having a small dielectric constant (k) value. The first insulation film 215A formed of glass powder may be patterned to cover only the upper portion of the gate electrode 221 and the gate line 216.

In addition, the first insulation film 215A may be patterned to cover only a portion of the dummy pattern 250. In other words, partial upper and lower portions of the dummy pattern 250 are not covered by the first insulation film 215A (Refer to FIG. 5B). According to this embodiment, even when the data line 217 is disconnected, the first insulation film 215A does not need to be welded.

In the LCD in accordance with the first and second embodiments, for example, the first insulation film may be formed at the data line region between the left and right dummy patterns. However, alternate embodiments may include the case where the first insulation film is not formed at the region between the left and right dummy patterns between which the data line passes through, which will be described in greater detail regarding a third embodiment of the present invention.

Figure 6:
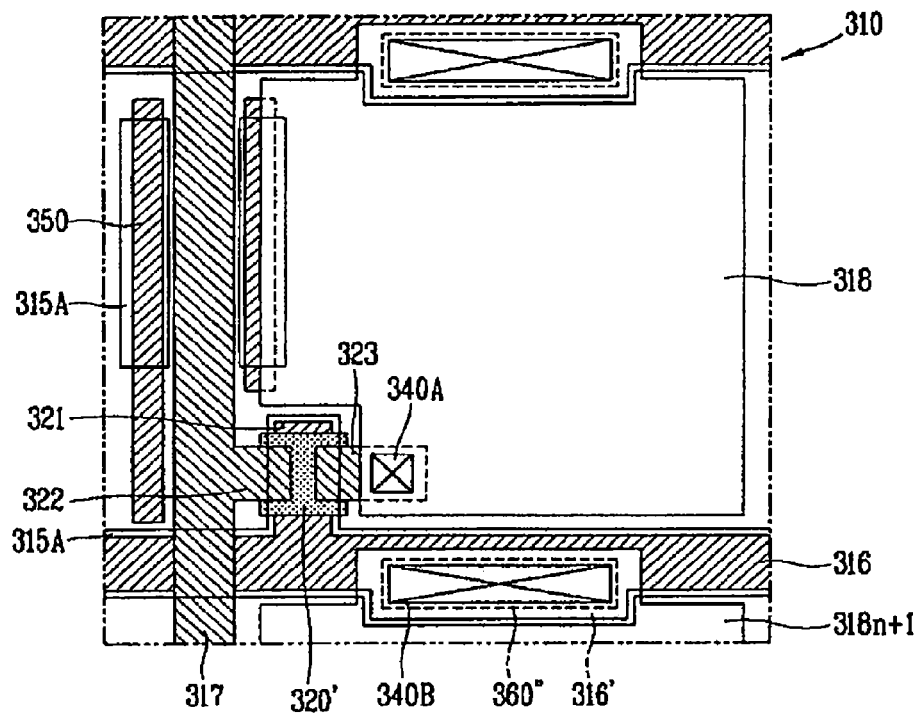
FIG. 6 is a plan view showing a portion of the array substrate of an LCD device in accordance with a third embodiment.

FIG. 6 is a plan view showing a portion of the array substrate of an LCD device in accordance with a third embodiment. As shown in FIG. 6, in a third embodiment, an array substrate 310 includes a gate line 316 to which a scan signal is applied from an external driving circuit (not shown), a data line 317 to which an image signal is applied, and a TFT, or a switching element, formed at the crossing of the gate line 316 and the data line 317.

The TFT includes a gate electrode 321 connected with the gate line 316, a source electrode 322 connected with the data line 317, and a drain electrode 323 connected with a pixel electrode 318. In addition, the TFT includes a first insulation film 315A for insulating the gate electrode 321, and the source and drain electrodes 322 and 323, and an active layer 320' for forming a conductive channel between the source electrode 322 and the drain electrode 323 by a gate voltage supplied to the gate electrode 321. A second insulation film (not shown) having a first contact hole 340A is positioned on the drain electrode 323, so that the drain electrode 323 and the pixel electrode 318 can be electrically connected through the first contact hole 340A.

A portion of the (m, n+1)th pixel electrode (318n+1) extends toward a gate line of a corresponding pixel, namely the nth gate line 316, to overlap with a first storage electrode 316' formed as a portion of the gate line 316 protrusion. The overlapped first storage electrode 316' and a portion of the (m, n+1)th pixel electrode (318n+1) form a storage capacitor with the first insulation film 315A interposed therebetween.

A dummy pattern 350 is formed at left and right regions of the data line 317 in order to repair the data line 317 when a disconnection deficiency occurs at the data line 317. The dummy pattern 350 can be positioned between the data line 317 and the pixel electrode 318 and formed as an opaque gate wire to serve as a blocking film for preventing light leakage due to a parasitic capacitance generated between the data line 317 and the pixel electrode 318.

A second storage electrode 360" is formed at an upper portion of the first storage electrode 316', and the second storage electrode is electrically connected with the (m, n+1)th pixel electrode (318n+1) through a second contact hole 340B formed at the second insulation film.

As mentioned above, the first insulation film 315A may be a glass powder having a small dielectric constant (k) value. The first insulation film 315A formed of glass powder is patterned to cover only the upper portion of the gate electrode 321 and the gate line 316. In addition, the first insulation film 315A is patterned to cover only a portion of the left and right dummy patterns 350. As in the second embodiment, partial upper and lower portions of the dummy pattern 250 are not covered by the first insulation film 315A. With this structure, even when the data line 317 is disconnected, the first insulation film 315A does not need to be welded. In other words, since the first insulation film 315A is not formed at the partial upper and lower portions of the dummy pattern 350, a welding process may be easily performed. In addition, the first insulation film 315A is patterned to cover only the left and right dummy patterns 350, so the first insulation film 315A is not formed at the region between the left and right dummy pattern 350 where the data line 317 passes through. As a result, the dummy pattern 350 and the data line 317 may be positioned on substantially same layer.

According to the first to third embodiments, as one example, the first insulation film may be formed at the upper portion of the dummy pattern. However, alternate embodiments may include the case where the first insulation film is not formed at an upper portion of the dummy pattern, which will be described in detail in a fourth embodiment.

Figure 7:
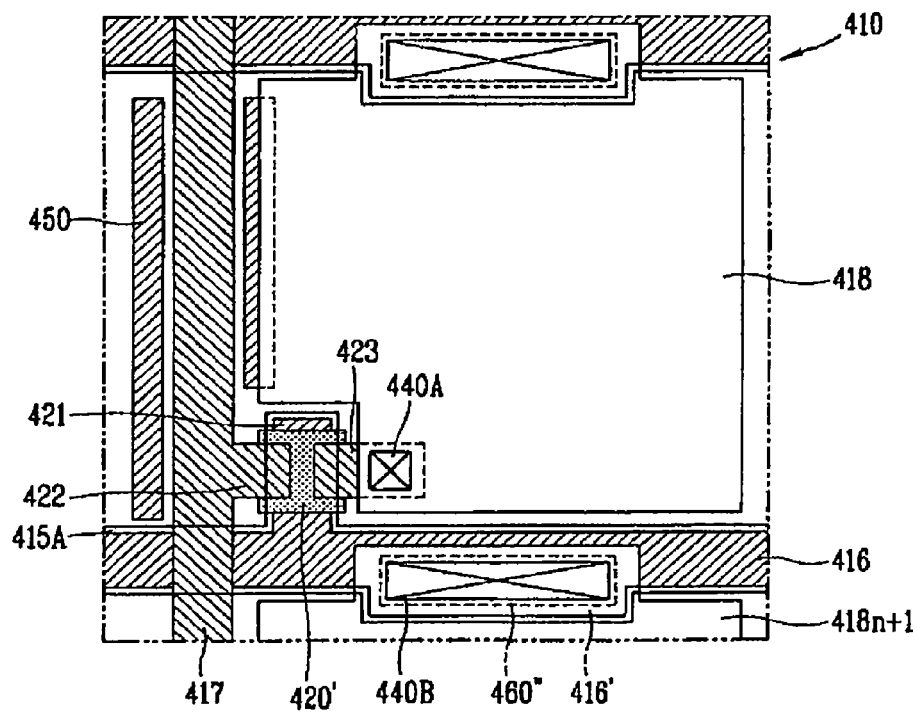
FIG. 7 is a plan view showing a portion of the array substrate of an LCD device in accordance with a fourth embodiment.

FIG. 7 is a plan view showing a portion of the array substrate of an LCD device in accordance with a fourth embodiment. As shown in FIG. 7, in a fourth embodiment, an array substrate 410 includes a gate line 416 to which a scan signal is applied from an external driving circuit (not shown), a data line 417 to which an image signal is applied, a TFT, namely a switching element, is formed at the crossing of the gate line 416 and the data line 417.

The TFT includes a gate electrode 421 connected with the gate line 416, a source electrode 422 connected with the data line 417, and a drain electrode 423 connected with a pixel electrode 418. In addition, the TFT includes a first insulation film 415A for insulating the gate electrode 421, and the source and drain electrodes 422 and 423, and an active layer 420' for forming a conductive channel between the source electrode 422 and the drain electrode 423 by a gate voltage supplied to the gate electrode 421. A second insulation film (not shown) having a first contact hole 440A is positioned on the drain electrode 423, so that the drain electrode 423 and the pixel electrode 318 can be electrically connected through the first contact hole 440A.

A portion of the (m, n+1)th pixel electrode (418n+1) extends toward a gate line of a corresponding pixel, namely the nth gate line 416 to overlap with a first storage electrode 416' formed as a portion of the gate line 416 protrusion. The overlapped first storage electrode 416' and a portion of the (m, n+1)th pixel electrode (418n+1) form a storage capacitor with the first insulation film 415A interposed therebetween.

A dummy pattern 450 is formed at certain left and right regions of the data line 417 in order to repair the data line 417 when a disconnection deficiency occurs at the data line 417. As mentioned above, the dummy pattern 450 can be formed at a certain portion of left and right side of the data line. The dummy pattern 450 may be positioned between the data line 417 and the pixel electrode 418 and formed as an opaque gate wire to serve as a blocking film for preventing light leakage due to a parasitic capacitance generated between the data line 417 and the pixel electrode 418.

A second storage electrode 460" may be formed at an upper portion of the first storage electrode 416', and the second storage electrode is electrically connected with the (m, n+1)th pixel electrode (418n+1) through a second contact hole 340B formed at the second insulation film.

As mentioned above, the first insulation film 415A may be a glass powder having a small dielectric constant (k) value. The first insulation film 415A formed of glass powder is patterned to cover only the upper portion of the gate electrode 421 and the gate line 416.

In this embodiment, the first insulation film 315A is not formed at the upper portion of the dummy pattern 350, so that when the data line 417 is disconnected, the first insulation film 415A does not need to be welded, and thus, a repairing process may be easily performed on the data line 417. The dummy pattern 450 and the data line 417 are positioned on substantially the same layer.

As the present embodiments may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

The invention claimed is:

1. A method for fabricating a liquid crystal display device, comprising:
    providing a gate electrode, a gate line and a dummy pattern on a substrate;
    forming a first insulation film formed of a glass powder on the gate electrode and the gate line;
    providing a switching element at a portion of the gate electrode, the switching element comprising a source electrode, a drain electrode and an active layer;
    providing a data line on the substrate that intersects with the gate line;
    forming an amorphous silicon thin film pattern at a lower portion of the data line;
    forming a second insulation film on the substrate having the source electrode, the drain electrode, the active layer and the data line;
    removing a portion of the second insulation film to form a first contact hole exposing a portion of the drain electrode; and
    forming a pixel electrode electrically connected with the drain electrode through the first contact hole;
    wherein the dummy pattern is formed adjacent to at least one side of the data line, and
    wherein some portions of the amorphous silicon thin film pattern are formed on the first insulation film and other portions of the amorphous silicon thin film pattern are formed on the substrate.

2. The method of claim 1, wherein a portion of the data line is formed on the first insulation film.

3. The method of claim 2, wherein the first insulation film is formed on the dummy pattern.

4. The method of claim 2, wherein the first insulation film is formed on a portion of the dummy pattern.

5. The method of claim 1, wherein the first insulation film is formed on a portion of the dummy pattern.

6. The method of claim 1, wherein the dummy pattern is formed at one of a left side, a right side, or both sides of the data line.

7. The method of claim 1, wherein the dummy pattern is formed through a fabrication process similar to the fabrication process of the gate electrode and the gate line.

8. The method of claim 1, wherein upon a disconnection defect occurring at the data line, the dummy pattern electrically connects an upper and a lower portion of the disconnected data line through a repairing process.

9. The method of claim 8, wherein the upper and the lower portion of the disconnected data line are electrically connected with the dummy pattern through welding.

10. The method of claim 9, wherein the welding is with a laser.

11. The method of claim 1, wherein the first insulation film is formed through a printing and sintering process.

12. The method of claim 1, wherein the first insulation film is formed through a coating and sintering process.

13. A method for repairing a liquid crystal display device, comprising:
    providing a gate electrode, a gate line and a dummy pattern on a substrate;
    forming a first insulation film formed of a glass powder on the gate electrode and the gate line;
    providing a switching element at a portion of the gate electrode, the switching element comprising a source electrode, a drain electrode and an active layer;
    providing a data line on the substrate that intersects with the gate line;
    repairing the data line by connecting with the dummy pattern;
    forming an amorphous silicon thin film pattern at a lower portion of the data line;
    forming a second insulation film on the substrate having the source electrode, the drain electrode, the active layer and the data line;
    removing a portion of the second insulation film to form a first contact hole exposing a portion of the drain electrode; and
    forming a pixel electrode electrically connected with the drain electrode through the first contact hole;
    wherein the dummy pattern is formed adjacent to at least one side of the data line, and
    wherein some portions of the amorphous silicon thin film pattern are formed on the first insulation film and other portions of the amorphous silicon thin film pattern are formed on the substrate.

14. The method of claim 13, wherein a portion of the data line is formed on the first insulation film.

15. The method of claim 14, wherein the first insulation film is formed on the dummy pattern.

16. The method of claim 14, wherein the first insulation film is formed on a portion of the dummy pattern.

17. The method of claim 13, wherein the first insulation film is formed on a portion of the dummy pattern.

18. The method of claim 13, wherein the dummy pattern is formed at one of a left side, a right side, or both sides of the data line.

19. The method of claim 13, wherein the dummy pattern is formed through a fabrication process similar to the fabrication process of the gate electrode and the gate line.

20. The method of claim 13, wherein the step of repairing includes electrically connecting the dummy pattern with an upper and a lower portion of a disconnected data line.

21. The method of claim 20, wherein the upper and the lower portion of the disconnected data line are electrically connected with the dummy pattern through welding.

22. The method of claim 21, wherein the welding is with a laser.

23. The method of claim 13, wherein the first insulation film is formed through a printing and sintering process.

24. The method of claim 13, wherein the first insulation film is formed through a coating and sintering process.

* * * * *